United States Patent [19]

Hara

[11] Patent Number: 4,700,063
[45] Date of Patent: Oct. 13, 1987

[54] ENCODER OUTPUT ERROR DETECTING CIRCUIT

[75] Inventor: Masato Hara, Tokyo, Japan

[73] Assignee: Asahi Kogaku Kogyo Kabushiki Kaisha, Tokyo, Japan

[21] Appl. No.: 851,183

[22] Filed: Apr. 14, 1986

[30] Foreign Application Priority Data

Apr. 25, 1985 [JP] Japan .................................. 60-90722

[51] Int. Cl.$^4$ ............................................. G01D 5/245
[52] U.S. Cl. ......................... 250/231 SE; 250/237 G; 356/395; 340/347 P
[58] Field of Search ............. 250/231 SE, 229, 237 G; 340/347 P; 356/395

[56] References Cited

U.S. PATENT DOCUMENTS

| | | | |
|---|---|---|---|
| 4,021,116 | 5/1977 | Martens | 356/395 |
| 4,491,826 | 1/1985 | Krogh et al. | 340/347 P |
| 4,551,715 | 11/1985 | Durbin | 250/231 SE |

Primary Examiner—Edward P. Westin
Assistant Examiner—Charles Wieland
Attorney, Agent, or Firm—Sughrue, Mion, Zinn, Macpeak & Seas

[57] ABSTRACT

An encoder having improved output abnormality detection. First and second input signals differing in phase from one another are compared by respective first and second comparators with a first reference level at an amplitude center of each of the first and second signals, and the outputs of the first and second comparators are applied to respective inputs of an EXCLUSIVE-OR gate. Third and fourth comparators compare a composite signal of the first and second signals with respective third and fourth reference levels located on opposite sides of the first reference level, and the output of the third and fourth comparators are applied to respective inputs of a first AND gate. A second AND gate, at the output of which the circuit output is provided, receives as inputs the output of the first AND gate and the output of the EXCLUSIVE-OR gate.

3 Claims, 5 Drawing Figures

ENCODER OUTPUT ERROR DETECTING CIRCUIT

BACKGROUND OF THE INVENTION

The present invention relates to an encoder output error detecting device for monitoring the differences between first and second signals in the form of a set of sine and cosine wave signals produced, for instance, by a photoelectric encoder. More particularly, the invention relates to such a detecting device which detects the differences in DC component, amplitude and phase between the two signals and the difference are controlled so as to not exceed certain tolerances.

Almost all the general purpose encoders (incremental encoders) commercially available are relatively low in accuracy, generating pulses with a scale pitch divided by a factor of four to eight. In such an encoder, the angle measurement accuracy is determined by the encoder scale manufacturing accuracy and by the adjustments performed after assembly. The ordinary conventional encoder is not provided with any output error detecting device.

On the other hand, some high-accuracy encoders have output error monitoring devices, as disclosed, for instance, in Japanese Laid-Open Patent Application No. 169027/1983.

The conventional device employs a method in which, in order to detect an output abnormality of a first signal, the first signal is compared with a reference signal at the rise of the second signal, and output abnormalities of the second signal and similarly detected using the first signal. However, this method whereby in order to detect the output abnormality of the first signal, the data of the second signal is utilized, and vice versa, suffers from the drawback that abnormalities cannot be detected if the two signals are greatly shifted in phase from each other or one of the signals is too low in level to provide a rectangular wave signal.

SUMMARY OF THE INVENTION

In order to eliminate the above-described drawback, an encoder output error detecting device of the invention employs, instead of the above-described method in which output abnormalities of the first signal are detected using the data of the second signal and vice versa, a method in which the data of the first and second signals are utilized together to detect the output abnormalities of the two signals. More specifically, in the inventive encoder, rectangular wave signals based on the first and second signals (comparison outputs of first and second comparators) are EXCLUSIVE-ORed, and a reference pulse based on the composite signal of the first and second signals (the logical product of the comparison outputs of third and fourth comparators) is formed. The EXCLUSIVE-OR signal and the reference pulse are subjected to comparison to simultaneously detect output abnormalities of the first and second signals relative to each other.

Accordingly, the invention provides an encoder output error detecting device having a simple circuit configuration, which eliminates the drawbacks accompanying the conventional method in which output abnormalities of the first and second signals are detected individually, and which can simultaneously output abnormalities of the first and second signal relative to each other using the data of the two signals.

DESCRIPTION OF THE PREFERRED EMBODIMENTS

A preferred embodiment of the invention will be described with reference to the accompanying drawings.

Figure 1:
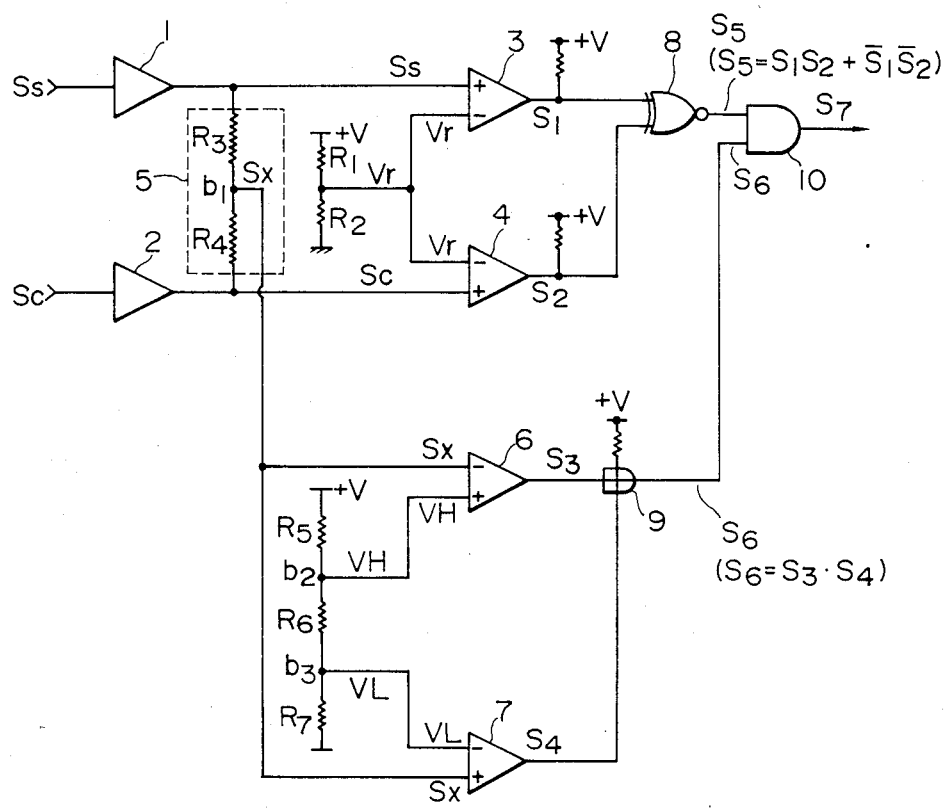
FIG. 1 is a circuit diagram of an output error detecting device according to the invention.

FIG. 1 is a circuit diagram of an encoder output error detecting circuit according to the invention. In FIG. 1, a first signal (for instance, a sine wave signal) $S_s$ is applied to an amplifier 1, and a second signal (for instance, a cosine wave signal) $S_c$ is applied to an amplifier 2. The outputs of the amplifiers 1 and 2 are applied to the positive input terminals of first and second comparators 3 and 4.

A first reference level $V_r$ is applied to the negative input terminal of the first and second comparators 3 and 4. The first reference level $V_r$ is obtained by dividing the voltage $+V$ of the positive power source with resistors $R_1$ and $R_2$. The resistors $R_1$ and $R_2$ have substantially equal resistance values, and hence the first reference level $V_r$ is a voltage level at the center of the first and second signals $S_s$ and $S_c$.

The outputs $S_s$ and $S_c$ of the amplifiers 1 and 2 are equally divided by resistors $R_3$ and $R_4$ (also of equal resistance values), which form a composite signal forming circuit 5, as a result of which a composite signal $S_x = (S_s + S_c)/2$, that is, a signal of a level equal to the average value of the first and second signals $S_s$ and $S_c$, is provided at the connecting point $b_1$ of the resistors $R_3$ and $R_4$.

The composite signal $S_x$ is applied to the negative input terminal of a third comparator 6 and to the positive input terminal of a fourth comparator 7. The voltage $+V$ of the positive power source is subjected to voltage division by resistors $R_5$, $R_6$ and $R_7$, which are connected in series. A second reference level $V_H$ and a third reference level $V_L$ are provided at the connecting points $b_2$ and $b_3$ of the resistors $R_5$, $R_6$ and $R_7$. The second and third reference levels $V_H$ and $V_L$ are on opposite sides of the first reference level $V_r$; that is, the second reference level $V_H$ is higher than the first reference level $V_r$, and the third reference level $V_L$ is lower than the first reference level $V_r$. The reference level $V_H$ is applied to the positive input terminal of the third comparator 6, while the reference level $V_L$ is applied to the negative input terminal of the fourth comparator 7.

The comparison output $S_1$ of the first comparator 3 and the comparison output $S_2$ of the second comparator 4 are applied to an EXCLUSIVE-OR gate 8. The comparison output $S_3$ of the third comparator 6 and the comparison output $S_4$ of the fourth comparator 7 are applied to a first AND gate 9, which may be a "wired" AND gate.

The output $S_5$ of the EXCLUSIVE-OR gate 8 and the output $S_6$ of the AND gate 9 are supplied to an AND gate 10, which provides an output error signal $S_7$.

The second reference level $V_H$ (higher than the first reference level $V_r$) and the third reference level $V_L$ (lower than the first reference level $V_r$) are equal in absolute value, and the voltage width therebetween can be selected according to the output error tolerance.

The operation of the circuit thus constructed will be described with reference to signal waveform diagrams shown in FIGS. 2 through 5.

It is assumed that the first signal $S_s$ is a standard signal. ($S_s = \sin \theta$) and the second signal $S_c$ includes various errors. Specifically, the second signal $S_c$ is represented by the following expression:

$$S_c = a_1 + a_2 \cdot \cos(\theta + a_3)$$

where $a_1$ is the DC component, $a_2$ is the amplitude error, and $a_3$ is the phase error.

Figure 3:
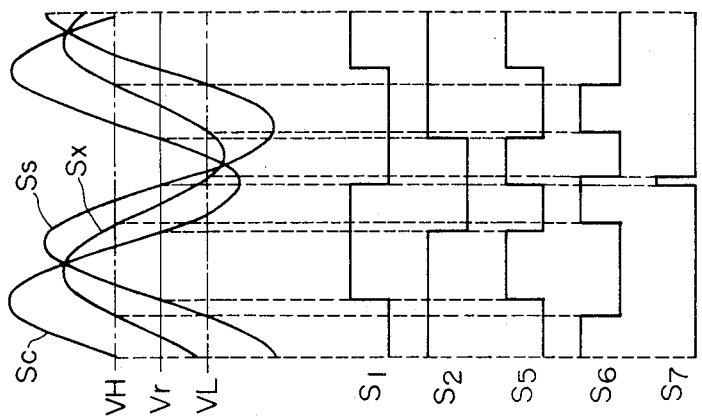
FIGS. 2 to 5 are waveform diagrams of signals at various parts in the circuit of FIG. 1.
Figure 2:
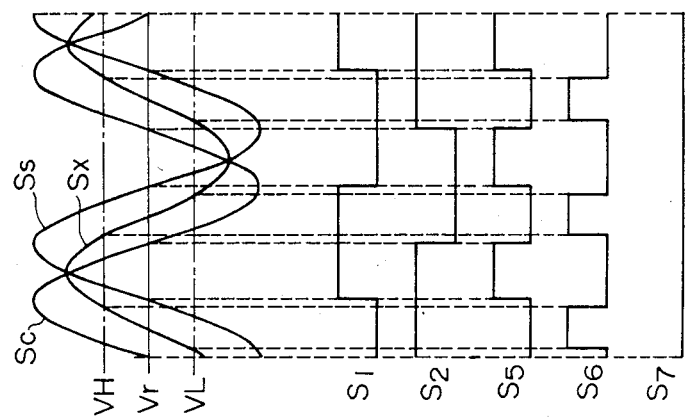
Figure 5:
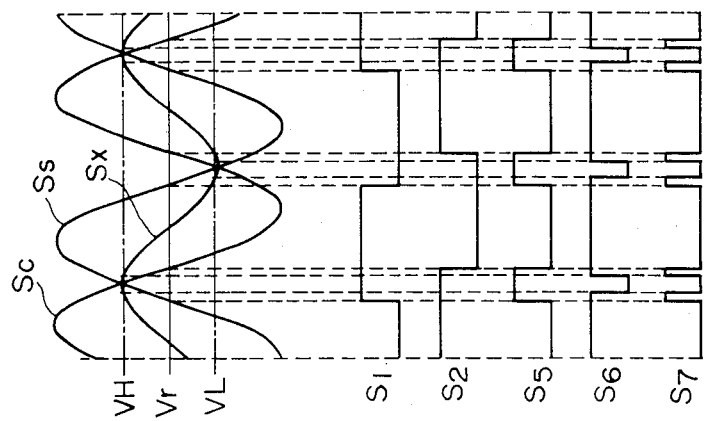
Figure 4:
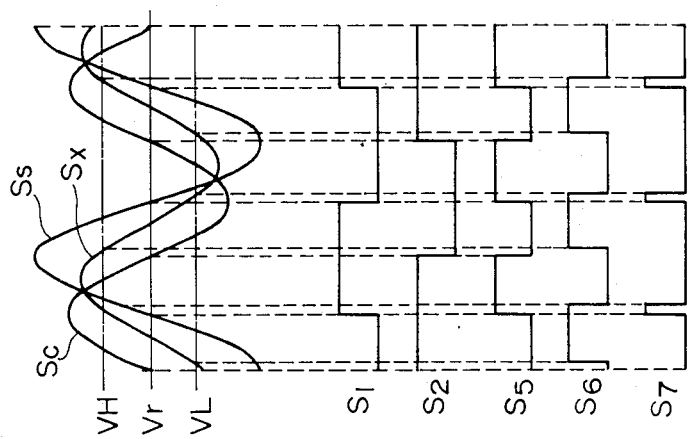

FIG. 2 shows the case where the second signal $S_c$ includes no error ($a_1 = a_3 = 0$ and $a_2 = 1$), FIG. 3 shows the case where the second signal $S_c$ includes a DC component ($a_1 = 0.3$, $a_2 = 1$, and $a_3 = 1$), FIG. 4 shows the case where the second signal $S_c$ includes an amplitude error ($a_1 = a_3 = 0$ and $a_2 = 0.7$), and FIG. 5 shows the case where the second signal $S_c$ includes a phase error ($a_1 = 0$, $a_2 = 1$, and $a_3 = 40°$).

In the case of FIG. 2, because the second signal $S_c$ includes no error, the output $S_5$ of the EXCLUSIVE-OR gate 8 and the output $S_6$ of the AND gate 9 will not be raised to the high level simultaneously, and accordingly, the output error signal $S_7$ is not provided (that is, it is not raised to the high level).

Both in the case of FIG. 3 and in the case of FIG. 5, the output error signal $S_7$ is produced; however, the form of the output error signal $S_7$ depends on what has caused the error (the amplitude error, the DC component, or the phase error).

In the case of FIG. 3, the second signal $S_c$ is shifted towards the side of the reference level $V_H$ because of the DC component $a_1 = 0.3$, as a result of which the pulse trains $S_5$ and $S_6$ include the parts which are raised to the high level simultaneously, whereby the output error signal $S_7$ is produced rising once every signal period, as shown in FIG. 3.

In the case of FIG. 4, the amplitude of the second signal $S_c$ is smaller than that of the first signal $S_s$ because of the amplitude error $a_2 = 0.7$, as a result of which the pulse trains $S_5$ and $S_6$ have several parts which are raised to the high level simultaneously, whereby the output error signal $S_7$ is produced rising twice every signal period, as shown in FIG. 4.

In the case of FIG. 5, the second signal $S_c$ leads the first signal $S_s$ by 130° because of the phase error $a_3 = 40°$, as a result the pulse trains $S_5$ and $S_6$ have a number of parts which are raised to the high level simultaneously, whereby the signal $S_7$ is produced rising four times every signal period, as shown in FIG. 5.

In the cases of FIGS. 2 through 5, the magnitudes of the second and third reference levels $V_H$ and $V_L$ are $V_H = V_L = 0.4 \times$ (the normal amplitude of the sine or cosine wave). If each signal error is smaller, then no output error signal $S_7$ is produced. If the reference level width is increased, then the output error signal $S_7$ may be produced more readily; however, it is desirable to empirically determine the reference level width according to the allowable errors.

In the above-described embodiment, the composite signal forming circuit 5 forms the composite signal $S_x$ based on the average value of the first and second signals $S_s$ and $S_c$; however, the circuit may be modified so that a composite signal based on a sum of the first and second signals $S_s$ and $S_c$ is formed.

As is apparent from the above description, in the encoder output error detecting device of the invention, when the first signal (sine wave signal) and the second signal (cosine wave signal) include at least one of a DC component, amplitude error or phase error, the corresponding output abnormality is detected by subjecting the EXCLUSIVE-OR output of the two signals and the composite signal (average value signal) of the same to comparison.

Furthermore, with the device of the invention, the difficulties accompanying the conventional method are eliminated, and output errors can be accurately detected. In addition, the device of the invention is advantageous in that the reference levels can be selected according to the allowable amounts of error.

The technical concept of the invention is applicable not only to a photoelectric encoders, but also to magnetic encoders and encoders utilizing moire fringes or interference fringes.

I claim:

1. An encoder which provides first and second signals different in phase from each other, comprising:
   first and second comparators for comparing said first and second signals with a first reference level at an amplitude center of each of said first and second signals;
   an EXCLUSIVE-OR circuit for EXCLUSIVE-ORing outputs of said first and second comparators;
   a composite signal forming circuit for forming a composite signal of said first and second signals;
   third and fourth comparators for comparing said composite signal formed by said composite signal forming circuit with second and third reference levels, respectively, on opposite sides of said first reference level;
   a first AND circuit for ANDing outputs of said third and fourth comparators; and
   a second AND circuit for ANDing an output of said first AND circuit and an output of said EXCLUSIVE-OR circuit.

2. The encoder output error detecting circuit as claimed in claim 1, in which said composite signal forming circuit comprises means for forming said composite signal according to an average value of said first and second signals.

3. The encoder output error detecting circuit as claimed in claim 1, in which said composite signal forming circuit comprises means for forming said composite signal according to a sum of said first and second signals.

* * * * *